United States Patent
Van Roosmalen et al.

(10) Patent No.: US 6,358,774 B1
(45) Date of Patent: Mar. 19, 2002

(54) METHOD OF MANUFACTURING A SEMICONDUCTOR DEVICE

(75) Inventors: Alfred J. Van Roosmalen; Klaastinus H. Sanders; Johan B. Kuperus; Jozeph P. K. Hoefsmit, all of Stadskanaal (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/623,883

(22) PCT Filed: Jan. 10, 2000

(86) PCT No.: PCT/EP00/00211

§ 371 Date: Sep. 11, 2000

§ 102(e) Date: Sep. 11, 2000

(87) PCT Pub. No.: WO00/42655

PCT Pub. Date: Jul. 20, 2000

(30) Foreign Application Priority Data

Jan. 11, 1999 (EP) .............................. 99200046

(51) Int. Cl.$^7$ ..................... H01L 21/44; H01L 21/48; H01L 21/50

(52) U.S. Cl. .................. 438/111; 438/106; 438/110

(58) Field of Search ................. 438/111, 110, 438/106

(56) References Cited

U.S. PATENT DOCUMENTS 5,506,174 A * 4/1996 Vandenheuvel et al.

* cited by examiner

Primary Examiner—Kevin M. Picardat
Assistant Examiner—D. M. Collins
(74) Attorney, Agent, or Firm—Steven R. Biren

(57) ABSTRACT

In the known method, a semiconductor element (1) is provided with two connecting conductors (2, 3) by arranging, preferably a large number of elements (1) between first and a second conductive plate (5, 6), the two connecting conductors (2, 3) secured at the upper surface and lower surface of an element (1) being formed from the two plates (5, 6). The first connecting conductor (5) is formed from a part (2) of the first plate (5) which borders on an opening (7), and the element (1) is covered with a protective envelope (4). The known method has the drawback that the devices obtained are not always directly suitable for surface mounting. Furthermore, the reliability of the device is sub-optimal. In a method in accordance with the invention, the second connecting conductor (3) of the element (1) is formed by electroconductively securing a part (3B) of the second plate (6) to a further part (3A) of the first plate (5), which further part borders on the opening (7), is situated opposite the part (2) of the first plate (5), and from said further part the second connecting conductor (3) is made. In this relatively simple manner, namely without the necessity of bending the two connecting conductors (2, 3) after the provision of the protective envelope (4), a device is obtained which can suitably be used for surface mounting. In addition, for several reasons the reliability of the device obtained is improved, so that the method can very suitably be used for so-called medium or high-power elements (1).

10 Claims, 4 Drawing Sheets

METHOD OF MANUFACTURING A SEMICONDUCTOR DEVICE

BACKGROUND OF THE INVENTION

The invention relates to a method of manufacturing a semiconductor device, in which at least one semiconductor element, but preferably a large number of semiconductor elements, are provided, at a first connecting region extending in a first plane, with a first connecting conductor and, at a second connecting region extending in a second plane opposite the first plane, with a second connecting conductor, whereafter the semiconductor element is surrounded with a protective envelope, the semiconductor element being arranged between a first and a second plate of a conductive material, the first plate being provided with an opening and the semiconductor element being electroconductively secured with its first connecting region to a part of the first plate adjoining the opening, and the first connecting conductor being formed from the part of the first plate adjoining the opening, and the semiconductor element being electroconductively secured with its second connecting region to a part of the second plate.

Such a method is known from United States patent specification U.S. Pat. No. 5,506,174, published on Apr. 9, 1996. In said document, a description is given of how a number of semiconductor elements, such as diodes, are soldered between two metal plates. The two connecting conductors of a diode are formed from strip-shaped parts of the plates which are secured to the connecting regions of the diodes. The semiconductor elements are provided with a protective housing from which the connecting conductors project at two opposite sides. To obtain an individual semiconductor device with a semiconductor element, the redundant parts of the two plates are removed. To render the semiconductor device suitable for so-called surface mounting, the connecting conductors on either side of the semiconductor element are bent downwards.

SUMMARY OF THE INVENTION

A drawback of the known method resides in that the resultant semiconductor device is insufficiently reliable. Another drawback is that the method is relatively complicated.

It is an object of the invention to provide a method which results in very reliable devices, and which is easy to implement.

To achieve this, a method in accordance with the invention is characterized in that the part of the second plate to which the semiconductor element is secured is electroconductively secured to a further part of the first plate which adjoins the opening, which further part is situated opposite the part of the first plate from which the first connecting conductor is formed and from which the second connecting conductor is formed. In this manner, a semiconductor device is obtained in a simple and reliable manner, which semiconductor device can suitably be used for surface mounting. This can be attributed to the fact that the first and the second connecting conductor are now situated next to one another in the plane of the first plate. After the protective envelope has been provided, the two connecting conductors no longer have to be bent, which has a favorable effect on the reliability of the protective envelope. In addition, during the manufacture, the second connecting conductor is firmly fixed because it is secured to the second plate (of which it forms part) but also because it is secured to both the semiconductor element and to a further part of the first plate. This means that also upon providing the protective envelope, the device is better resistant to the concomitant forces exerted on the device. A further important additional advantage of the device thus obtained resides in that the cooling of the semiconductor element, particularly via the second connecting conductor, is improved because this connecting conductor, at least the end portion thereof, has a thickness which corresponds to the sum of the thicknesses of both plates. This, among other reasons, renders the method in accordance with the invention particularly suitable for the manufacture of semiconductor devices with a semiconductor element which has to be operated at a high voltage and/or high power.

In a first modification of the method in accordance with the invention, the part of the second plate which is electroconductively secured to the semiconductor element is provided, at the location of the further part of the first plate, with a projection the height of which is approximately equal to the thickness of the semiconductor element. In this variant, bending of the part of the second plate which is secured to the semiconductor element and to the further part of the first plate can be entirely dispensed with. In a preferred modification of this variant, the semiconductor element is provided with the protective envelope by providing the material of the envelope between both plates. The individual semiconductor device can then be obtained by cutting the first and second plates through as well as the intermediate protective envelope in two mutually substantially perpendicular directions, the operation being performed by cutting through the opening at two sides of the semiconductor element. By cutting through the opening at two sides of the semiconductor element, it is achieved that the first and the second connecting conductor no longer contact each other. One of the two directions in which cutting is performed may alternatively be chosen so that cutting takes place through the above-mentioned projection, so that two adjacent semiconductor elements can make use of a single projection which provides both with (a part of) the second connecting conductor.

In a preferred embodiment of a method in accordance with the invention the part of the second plate which is electroconductively secured to the semiconductor element is partly cut from the second plate and partly bent from the second plate over a distance which is approximately equal to the thickness of the semiconductor element minus the thickness of the second plate. Said bending operation can be readily performed during the manufacture of the second plate and, in addition, does not have the drawbacks of the above-mentioned method in accordance with the prior art. Preferably, the degree to which the part of the second plate is bent outside the plane of the second plate does not exceed three times the thickness of the material. By virtue thereof, the second plate can be manufactured readily and reliably. In practice, the material thickness is for example 0.2 mm, so that 0.6 mm is three times the thickness of the material. In connection therewith, the thickness of the element preferably does not exceed 0.6 mm.

Preferably, the first plate is provided with a blank which comprises the opening and which substantially completely surrounds the part of the first plate to which the semiconductor element is secured and the further part of the first plate, and the second plate is provided with a blank which substantially completely surrounds the part of the second plate which is electroconductively secured to the semiconductor element and to the further part of the first plate. The part and the further part of the first plate and the part of the second plate are preferably each connected by means of two bridges to the rest of the first plate. This too can be readily achieved in the course of the manufacture of both plates. To finally unlink the individual semiconductor device from the two plates, these bridges can be cut through or broken through. In a favorable modification, the part and the further part of the first plate are each connected by means of three bridges to the rest of the first plate, two bridges being formed so as to adjoin the opening and the third bridge being formed opposite the opening. Consequently, the shape of the opening approximately resembles the shape of a channel, thus enabling the material of the protective envelope to be readily fed to the semiconductor element and between the first and the second connecting conductor.

A method in accordance with the invention can particularly suitably be used to simultaneously manufacture a large number of devices. This can be achieved by positioning the semiconductor elements in a one or two-dimensional array between the plates. Using an array of 70 by 20 semiconductor elements, 1400 devices can be simultaneously manufactured.

The provision of the protective envelope can be advantageously carried out, particularly in a variant of the above-described embodiment, in the following manner: first of all, the redundant parts of the second plate are removed by cutting or breaking through the bridges connecting the part of the second plate to the second plate. Subsequently, the first plate, on which the semiconductor elements with the part of the second plate are present, is provided with a matrix comprising chambers accommodating the semiconductor elements, and comprising channels leading to said chambers. Via these channels, a synthetic resin, such as epoxy, is supplied to the semiconductor elements by means of an injection molding process, around which semiconductor elements a protective envelope corresponding to the chambers is formed. Finally, after removing the matrix, individual semiconductor devices are obtained by removing the redundant parts of the first plate and the redundant synthetic resin parts corresponding to the channels in the matrix.

These and other aspects of the invention will be apparent from and elucidated with reference to the embodiment(s) described hereinafter.

In the drawings:

BRIEF DESCRIPTION OF THE DRAWING

The Figures are diagrammatic and not drawn to scale, particularly the dimensions in the thickness direction being exaggerated for clarity. Corresponding regions bear the same reference numerals whenever possible.

DESCRIPTION OF THE PREFERRED EMBODIMENTS

Figure 7:
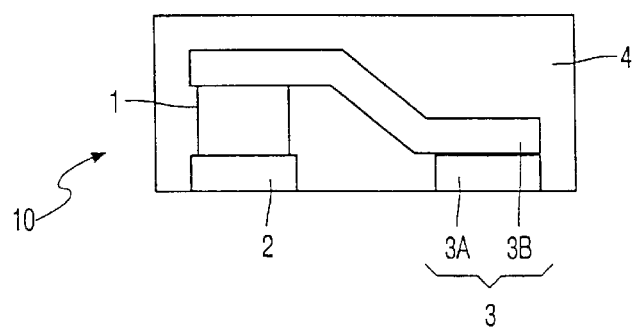

FIGS. 1 through 7 diagrammatically show, partly in a plan view and partly in a cross-sectional view at right angles to the thickness direction, a semiconductor device comprising a semiconductor diode at successive stages in the manufacturing process which is carried out by means of a first embodiment of a method in accordance with the invention. FIG. 7 is a diagrammatic, cross-sectional view at right angles to the thickness direction of a finished semiconductor device 10. This semiconductor device comprises a semiconductor element 1, here a semiconductor diode 1, which is provided with a first connecting conductor 2, here made of copper, and a second connecting conductor 3, which is also made of copper in this case. The diode 1 is secured onto the first connecting conductor 2, and the second connecting conductor 3 includes a part 3B which is secured to the diode 1, and also a further part 3A which extends in the same plane as the first connecting conductor 2 and to which the part 3B is secured. Consequently, the device 10 can suitably be used for so-called surface mounting. The device 10, and particularly the diode 1, is provided with a protective envelope 4, here made of epoxy. The length and the width of the device are approximately 3 and 1.5 mm, respectively, while the height is approximately 1 mm. The corresponding dimensions of the diode 1 are approximately 1, 1 and 0.35 mm, respectively. The thickness of the (parts of the) connecting conductors 2, 3 is approximately 0.2 mm. The device 10 is manufactured in the manner described hereinbelow, using a method in accordance with the invention.

Figure 1:
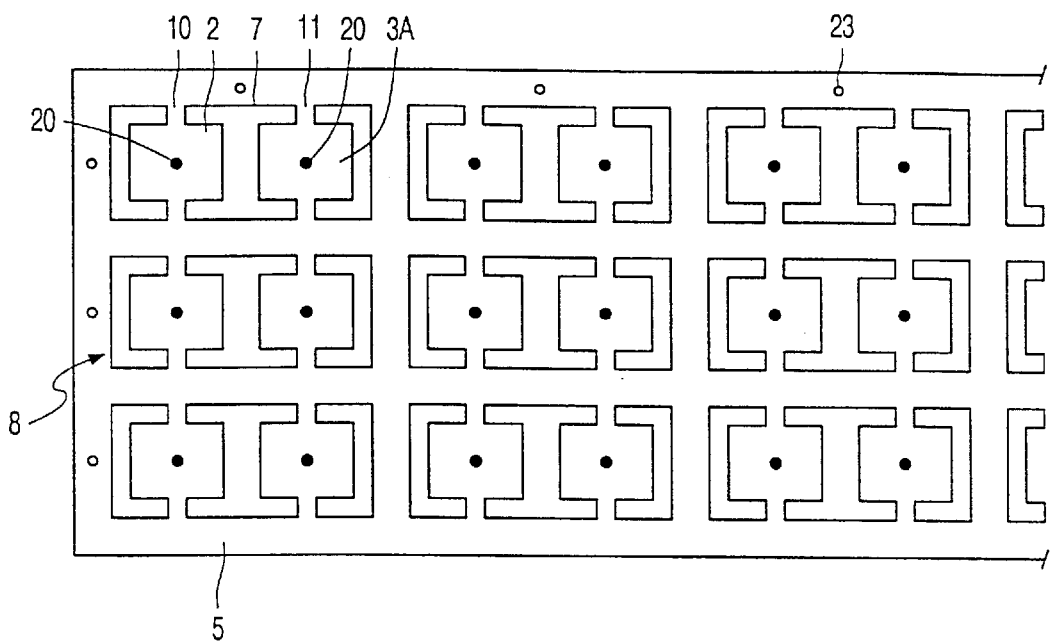
FIGS. 1 through 7 diagrammatically show, partly in a plan view and partly in a cross-sectional view at right angles to the thickness direction, a semiconductor device comprising a semiconductor diode at successive stages in the manufacturing process carried out by means of a first embodiment of a method in accordance with the invention.
Figure 2:
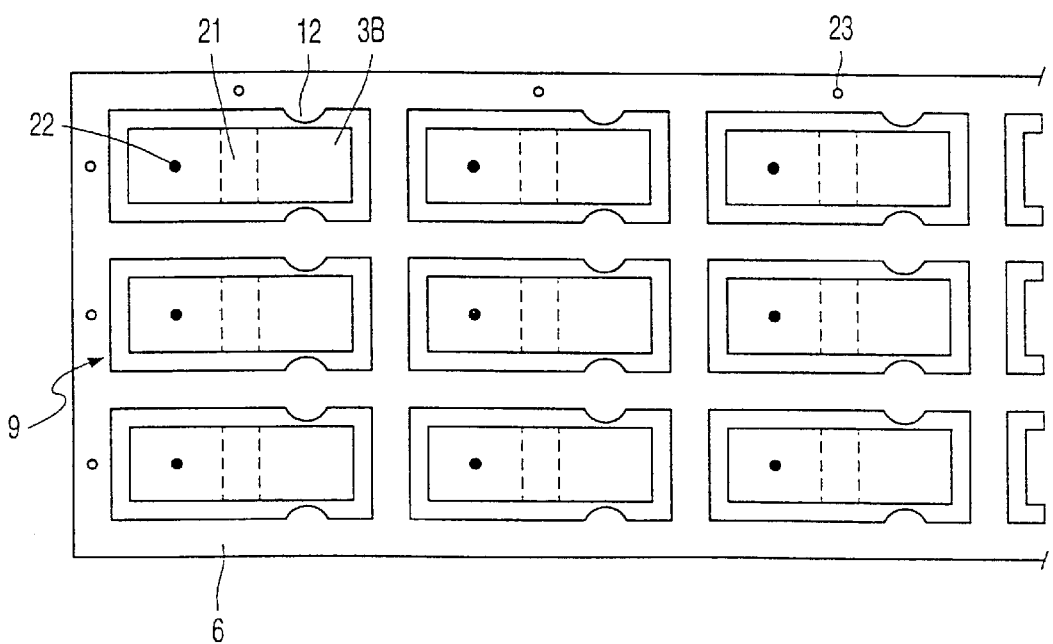
Figure 3:
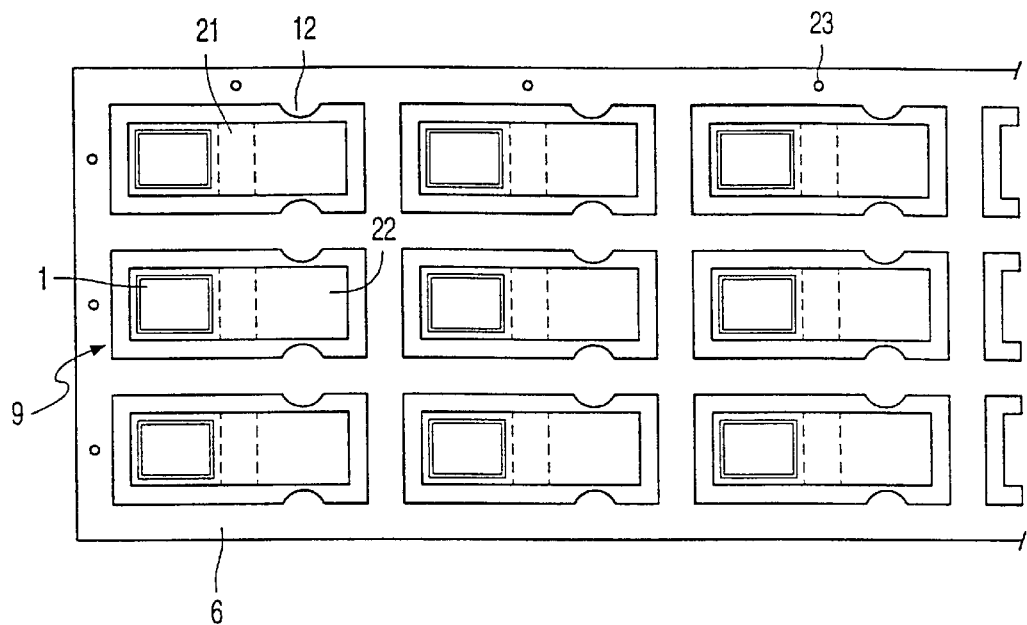

A first copper plate 5 and a second copper plate 6 are used as the starting components (see FIG. 1 and FIG. 2). The thickness of both plates is approximately 0.2 mm and their dimensions in this example are 40×150 mm². With these plates, approximately 600 individual semiconductor devices can be simultaneously manufactured. The first plate 5 (see FIG. 1) is provided with a blank 8, for example by punching, which blank includes an opening 7. A part 2 and a further part 3A of the plate 5 are formed so as to be adjacent to the opening 7, which parts have an approximately square geometry here and are connected by means of bridges 10, 11, serving as separating points, to the plate 5 and are provided with solder spots 20 of, in this case, a customary PbSn solder. The second plate 6 (see FIG. 2) is provided, in a manner similar to the first plate 5, with a blank 9, so that a part 3B of the second plate 6 is formed, which is connected to the second plate 6 via two bridges 12 serving as separating points. At the location of the bridges 12, the part 3B is situated in the plane of the second plate 6. On the other side of this part 3B, this part 3B is situated at some distance from the plane of the second plate 6. This is achieved by providing the part 3B with a curvature 21, for example by means of a pressing tool. The part 3B of the second plate 6 which is situated outside the second plate 6 is also provided with a solder spot 22. The solder spots 20, 22 are provided, in this case, by means of a dip-pin transfer process or by means of a dosing technique.

Figure 4:
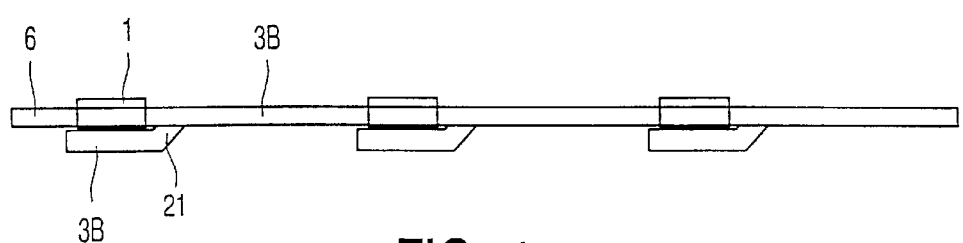
Figure 5:
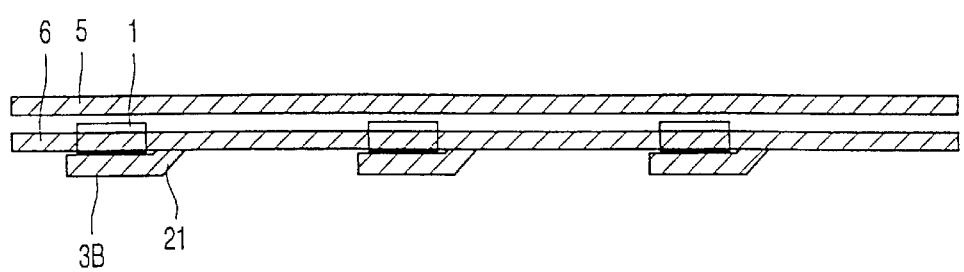
Figure 6:
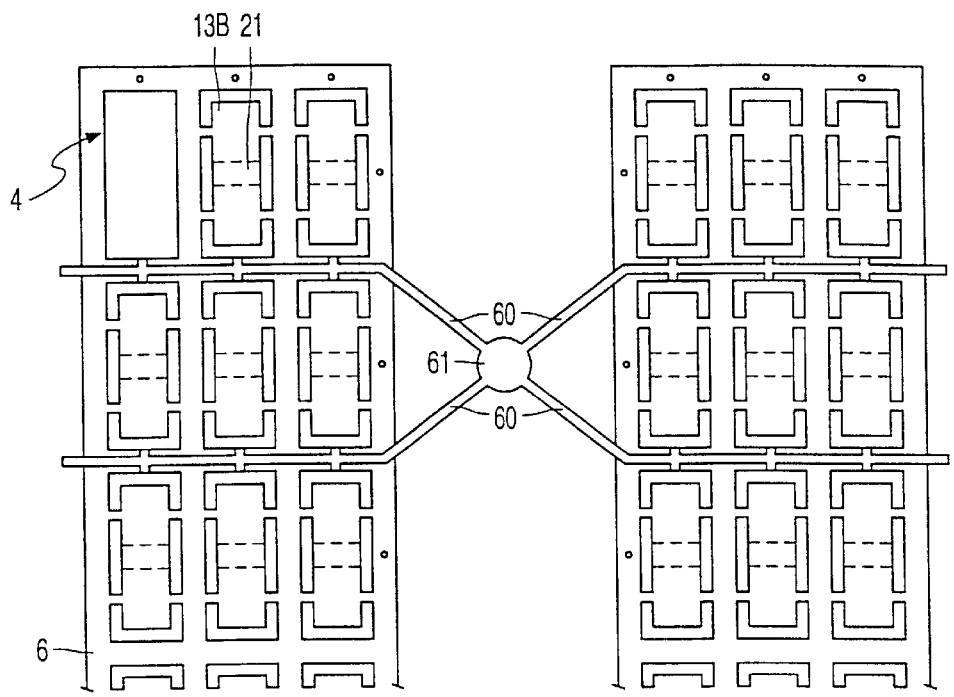

Subsequently, the second plate 6 is arranged in an auxiliary template (not shown in the drawing), the second plate 6 being fixed on centering pins (not shown in the drawing either), making use of further openings 23 provided in the second plate 6. Semiconductor elements 1 are introduced into a template (not shown either in the drawing) via a vibration mechanism, which template is provided with a pattern of holes which corresponds to the second plate 6. This template is evacuated causing the semiconductor elements 1 to be fixed in the template. Subsequently (see FIG. 3), the semiconductor elements 1 are removed from the template and placed on the solder spots 22 of the second plate 6. A cross-sectional view at right angles to the thickness direction of the device to be manufactured, which corresponds to this stage in the manufacturing process is shown in FIG. 4. Subsequently (see FIG. 5), the first plate 5 is invertedly arranged above the second plate 6, so that the solder spot 20 of the part 2 of the first plate 5 comes into contact with the other connecting region of the diode 1 and the solder spot 20 on the further part 3A of the first plate 5 comes into contact with the part 3B of the second plate 6. The first plate 5 is fixed with respect to the second plate 6 by means of the above-mentioned centering pins; for this purpose, also the first plate 5 is provided with openings 23.

Next, the resultant assembly of the first plate 5 and the second plate 6 is placed in a furnace with a nitrogen ambient (not shown in the drawing). By means of a suitable thermal treatment, the diode 1 is then electroconductively secured to the part 2 of the first plate 5 and to the part 3B of the second plate 6, the part 3B also being electroconductively connected to the further part 3A of the first plate 5. After removing the assembly from the furnace, in this example, the redundant parts of the second plate 6 are removed by breaking the bridges 12. Next, the assembly is ultrasonically cleaned, in particular to remove any residue of the flux used in the soldering process.

Subsequently (see FIG. 6), the remaining part of the assembly of the first and the second plate 5, 6 is arranged in a molding disc of a so-called transfer molding system. In view of the high packing density of the assembly, use is preferably made of so-called multi-plunger (60) injection molding. In this process, a protective envelope 4 of a synthetic resin, here an epoxy, is formed around the diode 1. The semiconductor devices 10 to be manufactured are formed by injection molding from a main supply line 61 via channels 60 at an end face. After the injection molding process, the redundant parts of the first plate 5 and synthetic resin burrs projecting from the device are removed by breaking. The device 10 thus obtained (see FIG. 7) can now be subjected to the final assembly operation.

Figure 8:
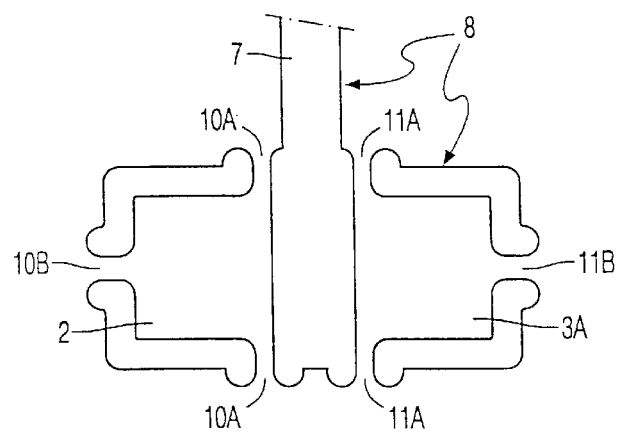
FIG. 8 shows a variant of a plate used in the manufacture of the device shown in FIG. 7, and FIGS. 9 through 11 diagrammatically show, partly in a plan view and partly in a cross-sectional view at right angles to the thickness direction, a semiconductor device comprising a semiconductor diode at successive stages in the manufacturing process carried out by means of a second embodiment of a method in accordance with the invention.

FIG. 8 is a diagrammatic plan view of (a part of) an attractive variant of the first plate 5. The part 2 and the further part 3A thereof are formed in such a manner that the opening 7 between them is channel-shaped. Two bridges 10A, 11A of the part 2 and the further part 3A are situated on either side of the opening 7, and a third bridge 10B, 11B is situated opposite the opening 7. On the upper side, the opening 7 is in communication with a corresponding opening 7 of a further device 10 to be formed. This variant is very suitable for the above-described (injection) molding process: the synthetic resin necessary to form the protective envelope 4 can be readily supplied via the channel-shaped opening 7 to two devices 10 at a time which are to be manufactured.

Figure 9:
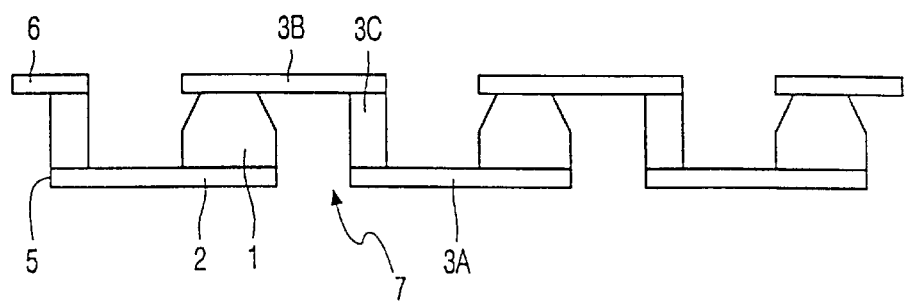
Figure 10:
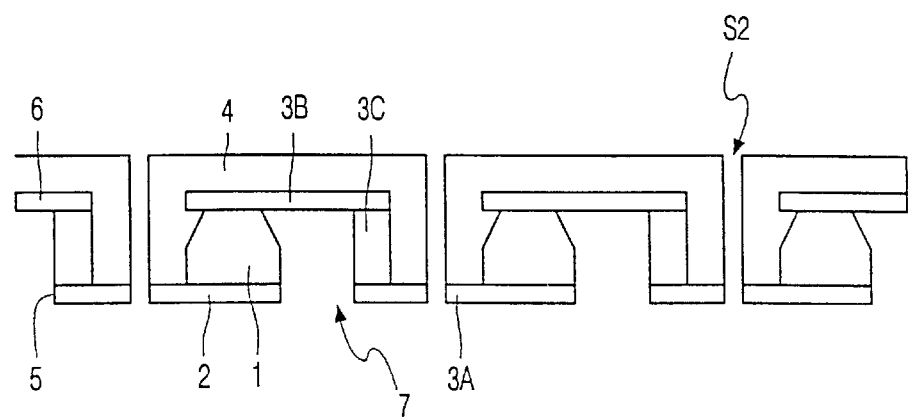
Figure 11:
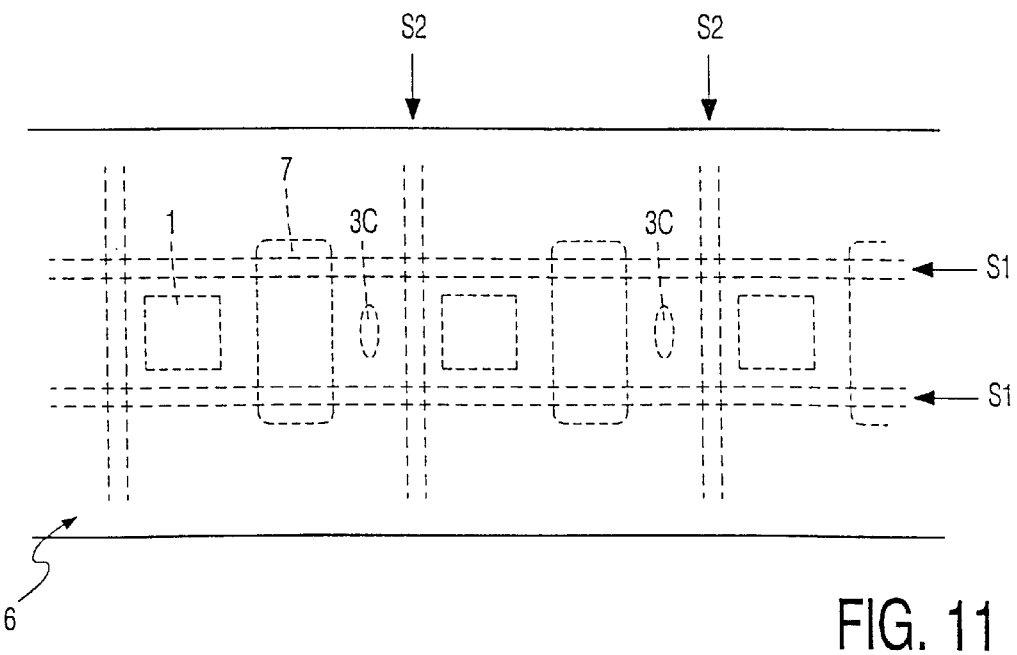

FIGS. 9 through 11 diagrammatically show, partly in a plan view (FIG. 11) and partly in a cross-sectional view at right angles to the thickness direction (FIGS. 9 and 10), a semiconductor device 10 comprising a semiconductor diode 1 at successive stages in the manufacturing process which is carried out by means of a second embodiment of a method in accordance with the invention. The discussion of this second embodiment is limited to essential differences with respect to the first example. The first plate 5 is provided with an opening 7, as shown in FIG. 11. On either side of the opening 7 there are solder spots on one of which the diode 1 is placed. In this example, the second plate 6 is not provided with openings, blanks or curvatures but instead, at the location of the part 3A of the first plate 5, with a copper projection 3C (see FIG. 9) the thickness of which corresponds approximately to the thickness of the diode 1. During the soldering process, this projection 3C is electroconductively secured to the further part 3A of the first plate 5.

In the course of the above-described (injection) molding process, the entire intermediate space between the first plate 5 and the second plate 6 is filled with the material of the protective envelope 4. This material is provided also above the second plate 6. The individual devices 10 are now obtained by cutting the assembly of the first plate 5 and second plate 6 in two, mutually substantially perpendicular directions S1, S2. Two saw cuts S1 on either side of each device 10 to be formed are positioned so that they touch or cross the opening 7. Thus, also by means of this variant a device 10 corresponding to that shown in FIG. 7 is obtained. This variant of a method in accordance with the invention has the following advantages. First of all, injection molding of the protective envelope is simpler because it does not have to be carried out separately for each individual device. Further, the loss of material, both of the plate and the protective envelope, is small because this method enables a very great packing density of devices to be achieved. In a modification of this embodiment, a projection 3C is shared by two adjacent diodes 1. One of the saw cuts S2 will then be provided so as to (centrally) cross the projection 3C.

The invention is not limited to the above-described examples because within the scope of the invention many variations and modifications are possible to those skilled in the art. For example, semiconductor elements other than diodes can be used, for example transistors. In that case, one of the two plates is provided with another part from which a third connecting conductor can be formed. Also the geometry, dimensions and materials of the various parts of the device may be chosen to be different. For example, if desired the part and the further part of the first plate may have a different geometry or dimension. It is also possible to use different techniques, for example, instead of a soldered joint the semiconductor element can be secured to the connecting conductors by means of a conductive adhesive. Furthermore, the curvature, possibly used in the invention, of a part of the plates does not necessarily have to be used in a part of the second plate. Also the part of the first plate which is secured to the semiconductor element may be bent from this plate, in which case the second plate may be embodied so as to be entirely flat. Finally, it is noted that the invention is not limited to the manufacture of devices comprising only a single (discrete) element. One or more additional elements may be manufactured in parallel or in series. Particularly the method of manufacturing in accordance with the invention in which two plates are used can particularly suitably be used for this purpose.

What is claimed is:

1. A method of manufacturing a semiconductor device, in which at least one semiconductor element (1) is provided, at a first connecting region extending in a first plane, with a first connecting conductor (2) and, at a second connecting region extending in a second plane opposite the first plane, with a second connecting conductor (3), whereafter the semiconductor element (1) is covered with a protective envelope (4), the semiconductor element (1) being arranged between a first and a second plate (5, 6) of a conductive material, the first plate (5) being provided with an opening (7) and the semiconductor element (1) being electroconductively secured with its first connecting region to a part (2) of the first plate (5) adjoining the opening (7), and the first connecting conductor (2) being formed from the part (2) of the first plate (5) adjoining the opening (7), and the semiconductor element (1) being electroconductively secured with its second connecting region to a part (3B) of the second plate (6), characterized in that the part (3B) of the second plate (6) to which the semiconductor element (1) is secured is also electroconductively connected to a further part (3A) of the first plate (5) which adjoins the opening (7), which further part is situated opposite the part (2) of the first plate (5) from which the first connecting conductor (2) is formed and from which the second connecting conductor (3) is formed, wherein the first connection region and the first plate are coplanar.

2. A method as claimed in claim 1, characterized in that the part (3B) of the second plate (6) which is electroconductively secured to the semiconductor element (1) is provided, at the location of the further part (3A) of the first plate (5), with a projection (3C) the height of which is approximately equal to the thickness of the semiconductor element (1).

3. A method as claimed in claim 1, characterized in that the part (3B) of the second plate (6) which is electroconductively secured to the semiconductor element (1) is partly cut from the second plate (6) and partly bent from the second plate (6) over a distance which is approximately equal to the thickness of the semiconductor element (1) minus the thickness of the second plate (6).

4. A method as claimed in claim 1, characterized in that the first plate (5) is provided with a blank (8) which comprises the opening (7) and which substantially completely surrounds the part (2) of the first plate (5) to which the semiconductor element (1) is secured and the further part (3A) of the first plate, and the second plate (6) is provided with a blank (9) which substantially completely surrounds the part (3B) of the second plate (6) which is electroconductively secured to the semiconductor element (1) and to the further part (3A) of the first plate (5).

5. A method as claimed in claim 4, characterized in that the part (2) and the further part (3A) of the first plate (5) and the part (3B) of the second plate (6) are each connected by means of two bridges (10, 11, 12) to the rest of the first and the second plate (5, 6).

6. A method as claimed in claim 4, characterized in that the part (2) and the further part (3A) of the first plate (5) are each connected by means of three bridges (10, 11) to the rest of the first plate (5), two bridges (10A, 11A) being formed so as to adjoin the opening (7) and the third bridge (10B, 11B) being formed opposite the opening (7).

7. A method as claimed in claim 1, characterized in that a number of semiconductor elements (1) are secured to the first and the second plate (5, 6), which are positioned in a one or two-dimensional array, so that a number of semiconductor devices can be manufactured at the same time.

8. A method as claimed in claim 7, characterized in that the space between the first plate (5) and the second plate (6) is filled with the material used for the protective envelope (4), whereafter the semiconductor element (1) provided with the first and the second connecting conductor (2, 3) and with the protective envelope (4) is formed by cutting the first and the second plate (5, 6) through in two mutually substantially perpendicular directions (S1, S2), which operation is performed by cutting through the opening (7) at two sides of the semiconductor element (1).

9. A method as claimed in claim 7, characterized in that prior to the provision of the protective envelope (4), the redundant parts of the second plate (6) are removed, a matrix which is filled with the material of the protective envelope is provided on top of the first plate (5) to which the semiconductor element is connected, and, after removing the matrix, the semiconductor element (1) provided with the connecting conductors (2, 3) and the protective envelope (4) is obtained by removing the redundant parts of the first plate (5).

10. A semiconductor device manufactured by means of a method as claimed in claim 1, characterized in that the thickness of the semiconductor element is chosen to range between 0.15 and 0.6 mm.

\* \* \* \* \*